(12) United States Patent
Karandikar et al.

(10) Patent No.: US 7,169,465 B1
(45) Date of Patent: Jan. 30, 2007

(54) LOW EXPANSION METAL-CERAMIC COMPOSITE BODIES, AND METHODS FOR MAKING SAME

(76) Inventors: Prashant G. Karandikar, 113 Cypress Point, Avondale, PA (US) 19311; Jai R. Singh, 86 Ironwood Rd., Trumbull, CT (US) 06611; Clarence A. Andersson, 10 E. Possum Hollow Rd., Wallingford, PA (US) 19086

( * ) Notice: Subject to any disclaimer, the term of this patent is extended or adjusted under 35 U.S.C. 154(b) by 432 days.

(21) Appl. No.: 10/073,818

(22) Filed: Feb. 11, 2002

Related U.S. Application Data (63) Continuation-in-part of application No. 09/378,367, filed on Aug. 20, 1999, now Pat. No. 6,355,340.

(51) Int. Cl.
*B32B 9/00* (2006.01)
(52) U.S. Cl. ............... 428/312.8; 428/304.4; 428/311.51; 428/312.2
(58) Field of Classification Search ........... 428/212, 428/218, 408, 698
See application file for complete search history.

(56) References Cited

U.S. PATENT DOCUMENTS

| | | | |
|---|---|---|---|
| 3,622,283 A | 11/1971 | Sara | |
| 3,766,000 A | 10/1973 | Gibson et al. | |
| 3,807,996 A | 4/1974 | Sara | |
| 3,994,867 A | 11/1976 | Baughman et al. | |
| 4,005,183 A | 1/1977 | Singer | |

(Continued)

FOREIGN PATENT DOCUMENTS

DE 197 11 831 A1 9/1998

(Continued)

OTHER PUBLICATIONS

"BP Amoco Chemicals—Carbon Fibers", selected pages (9) from website www.bpamococarbonfibers.com, Copyright 2000 BP Amoco plc.

(Continued)

*Primary Examiner*—Richard Weisberger
(74) *Attorney, Agent, or Firm*—Law Office of Jeffrey R. Ramberg (57) ABSTRACT

A low CTE metal-ceramic composite material featuring carbon fibers reinforcing a matrix featuring silicon metal or silicon alloy. The fibers have a low coefficient of thermal expansion (CTE) in the axial direction, and preferably negative. The principles of making Si/SiC composites can be adapted to produce the instant Si matrix composites. The CTE of the composite body depends not only upon the relative CTE's of the fibers and matrix, and their relative amounts (e.g., loadings), but also upon the relative elastic moduli of the fibers and matrix. Thus, Si/SiC matrices produced by a reaction-bonding process inherently possess low CTE, but the instant inventors prefer to make such composites having relatively large fractions of unreacted silicon, thereby driving composite CTE lower still. Here, the carbon fibers are protected from reaction with the silicon infiltrant with one or more materials disposed between the fibers and the infiltrant. Providing at least a degree of toughness or impact resistance can also be realized in these composites. Laminates produce Isotropic or quasi-isotropic properties in the composite body can be realized by, for example, providing the fibers in the form of cross-plied laminates featuring the fibers in parallel or woven arrays.

40 Claims, 5 Drawing Sheets

U.S. PATENT DOCUMENTS

| | | |
|---|---|---|
| 4,083,719 A | 4/1978 | Arakawa et al. |
| 4,157,409 A | 6/1979 | Levitt et al. |
| 4,376,803 A | 3/1983 | Katzman |
| 4,451,118 A | 5/1984 | Stalcup et al. |
| 4,535,035 A | 8/1985 | Smialek et al. |
| 4,791,076 A | 12/1988 | Leggett et al. |
| 4,804,586 A | 2/1989 | Tanaka et al. |
| 4,944,904 A | 7/1990 | Singh et al. |
| 5,015,540 A | 5/1991 | Borom et al. |
| 5,330,807 A | 7/1994 | Williams |
| 5,834,115 A | 11/1998 | Weeks, Jr. et al. |
| 5,993,934 A | 11/1999 | Reese et al. |
| 6,030,913 A | 2/2000 | Heine et al. |
| 6,079,525 A | 6/2000 | Dietrich et al. |
| 6,221,475 B1 | 4/2001 | Domergue et al. |
| 6,261,981 B1 | 7/2001 | Dietrich et al. |
| 6,328,834 B1 | 12/2001 | Rebstock et al. |

FOREIGN PATENT DOCUMENTS

| | | |
|---|---|---|
| EP | 1124074 | 8/2001 |

OTHER PUBLICATIONS

Max L. Lake, "Diamond Fibers for Heat Sinks *Diamond Fibers for Thermal Energy Management", 1991 BMDO Phase I SBIR Award (abstract only).

William E. Davis, "Affordable, High Performance Composites", 1996 Air Force Phase II SBIR Award (abstract only).

Mark J. Montesano, "Thermal Management for Advanced 3D Packaging of Payload Electronics", 1999 Air Force Phase I SBIR Award (abstract only).

FIG. 6C

LOW EXPANSION METAL-CERAMIC COMPOSITE BODIES, AND METHODS FOR MAKING SAME

CROSS-REFERENCE TO RELATED APPLICATIONS

This patent document is a Continuation-in-Part of U.S. patent application Ser. No. 09/378,367, filed on Aug. 20, 1999 now U.S. Pat. No. 6,355,340.

BACKGROUND OF THE INVENTION

1. Field of the Invention

The present invention relates to composite materials having a low coefficient of thermal expansion (CTE). In particular, the invention relates to metal-ceramic composites possessing low, preferably near-zero CTE's, and preferably also high thermal conductivity.

2. Discussion of Related Art

It has been known for a long time to add fibrous reinforcement to metals to increase mechanical properties such as specific strength and specific stiffness. One of the early such reinforcements was carbon or graphite fiber, produced from polymer precursors. The resulting composite material offered double or triple the strength or stiffness compared to the bulk, unreinforced metal. Processing was difficult, however, as the metals either tended not to wet the carbon fibers, or reacted with the carbon. Considerable energy has been devoted to developing ways to preserve the chemical and physical integrity of the fibers while rendering them more chemically compatible with the metal matrix.

Carbon fibers can be manufactured with high degrees of anisotropy. The graphite form of carbon in particular features a hexagonal crystallographic structure, with the covalent bonds within the {001} planes being strong, and the bonds between the {001} planes consisting of weak van der Waals bonds. It is possible to preferentially align the crystallographic planes in a graphite fiber such that the {001} planes tend to be parallel to the graphite fiber axis. By increasing the relative amount of covalent bonds in the fiber axis direction, a fiber possessing high strength and high elastic modulus in the direction of the fiber axis is produced. An interesting phenomenon that accompanies the alignment of the high strength, high modulus directions is that this particular direction also possesses a (rare) negative CTE. Thus, instead of expanding upon heating like most materials, these fibers actually shrink in the axial direction. In the radial direction of such fibers, however, the strength and elastic moduli are relatively low and the CTE is positive and relatively high.

By incorporating parallel arrays of such fibers into a positive CTE isotropic matrix, a composite material having a high modulus and a zero or near-zero CTE in the axial direction of the fibers can be produced. In the direction transverse to the fiber axes, the modulus would be relatively low and the CTE would be relatively high. Because of the axial stiffness, the properties of the composites tend to be dominated by the axial properties.

The degree of anisotropy can be reduced by distributing the fiber orientations. One technique for accomplishing this is to arrange the fibers in parallel within a thin sheet or "ply", and to place a number of such plies on top of one another such that fibers in one ply are skew with respect to fibers in an adjacent ply. With suitable arrangements of the plies it is possible to produce quasi-isotropic sheet materials. Quasi-isotropic lay-ups of thin plies of the composite can be achieved by orienting successive plies at 0°, +45°, −45° and 90°; or 0°, +60° and −60° with respect to the fiber axes. The distribution of the fiber directions, however, significantly reduces the CTE influence of the fibers (as will be illustrated later); thus, it becomes that much more difficult to produce composites that have zero or near-zero CTE's in the dominant plane of the composite.

U.S. Pat. No. 3,807,996 to Sara teaches a carbon fiber reinforced nickel matrix composite material. Sara discloses the use of high strength, high modulus carbon fibers, as well as various geometrical arrangements of the fibers, such as arrays (plates) of parallel fibers and cross-plies (laminates) of such arrays.

U.S. Pat. No. 4,083,719 to Arakawa discloses a carbon fiber reinforced copper composite featuring a low thermal expansion coefficient and no directional characteristic of the mechanical properties. The resulting composite bodies featured CTE as low as $4 \times 10^{-6}$ cm/cm per degree K (hereinafter conveniently referred to as "parts per million per degree Kelvin" or ppm/K)

U.S. Pat. No. 4,157,409 to Levitt et al. discloses treating carbon fibers with molten NaK to permit wetting by molten aluminum, magnesium, copper, zinc, tin or lead matrix metals.

U.S. Pat. No. 5,834,115 to Weeks, Jr. et al. discloses protecting carbonaceous reinforcement materials such as fibers with molybdenum carbide and then infiltrating with a molten metal to produce a composite body. A woven fabric of coated graphite fibers reinforcing a copper matrix exhibited a CTE between about 4 and 7 ppm/K).

High modulus carbon fibers have also been incorporated into polymeric matrices. U.S. Pat. No. 5,330,807 to Williams discloses a composite laminated tubing intended for offshore oil extraction operations. There the problem was the need to transfer oil in a tube over appreciable distances and in which the tube may undergo considerable temperature excursions due to the elevated temperature of the extracted oil. To minimize the expansion of the tube length and thereby ameliorate the propensity for the tube to fail by buckling, the tubing is made of a plurality of layers of fibers fixed in a plastic matrix. The fibers may be graphite fibers, glass fibers, ceramic fibers or polymer fibers, but in any case the fibers have a sufficiently low CTE as to impart to the tubing an overall CTE of no more than about 1.1 ppm/K, and a Poisson's ratio near 0.5.

In many environments, however, polymer matrix composites cannot be used because of insufficient resistance to extremes of temperature, corrosion or radiation. Accordingly, some workers have used glass as the matrix material. Glass has several attractive properties for these types of materials, including fluidity or flowability, wettability to the fibers and the potential for relatively low CTE's. For a laser mirror application, for example, Stalcup et al. (U.S. Pat. No. 4,451,118) hot pressed a mixture of a low expansion borosilicate glass and alternating plies of high modulus graphite fibers. Some of the graphite fibers were arranged perpendicular to the reflecting surface so as to be better able to conduct heat away from the mirror surface. Still, cooling passages had to be placed into the mirror structure to permit circulation of a heat exchange fluid.

Similarly, in U.S. Pat. No. 4,791,076 Leggett et al. discloses a graphite fiber silica matrix composite composition having a near-zero overall CTE. In addition to silica, the matrix contains boron phosphate and beta-spodumene, and Leggett states that the composite CTE is tailorable between −1 and +1 ppm/K by varying the matrix composition. As a consequence of the low CTE, very little thermal distortion occurred in for example, a laser mirror application, particularly at low coolant flow rates. This glass matrix composite material exhibited much less thermal distortion than did other laser mirror materials such as single crystal molybdenum or silicon. Although the cooling requirements were reduced, active cooling techniques involving heat transfer media flowing through channels in the mirror still were required.

As mentioned above, glass matrix composites have been used in environments where low expansion polymer composites would be insufficiently durable. Many of these applications, however, require high thermal conductivity, and most glasses are deficient in this area. Thus, composites workers have attempted to address the thermal conductivity problem by relying on the carbon fibers to carry this responsibility, the carbon fibers possessing relatively high thermal conductivity in the fiber axis direction. Another problem with glass matrix composites, though, is that they tend to be brittle. In many applications in which such composites are subjected to accelerations and stresses, such as with semiconductor fabrication equipment, it would be preferable to have a tougher, more impact resistant material.

A number of metals are intrinsically highly thermally conductive and tough, and possessing low specific gravity and sufficient durability in harsh environments as to make them candidates for aerospace or precision equipment applications. Unfortunately, these metals suffer from having relatively high CTE's—typically around 20 ppm/K or higher. There seem to be no successes or even proposals to make composites using these high modulus carbon fibers as the reinforcement of a light metallic matrix for the express purpose of producing very low CTE metal matrix composites. The lowest CTE achieved for such MMC's appears to be the 4 ppm/K of U.S. Pat. No. 4,083,719, which represents work done years ago. While quite low in comparison to unreinforced metals, there are applications, such as in optical systems that undergo temperature fluctuations, where even lower CTE's would be desirable.

Some workers in the field of fiber-reinforced silicon carbide composites, particularly SiC composites made by a reaction-bonding process, intrinsically yield low expansion materials, particularly since each component of the composite is a low expansion material. For example, U.S. Pat. No. 6,248,269 to Dietrich et al. discloses a reaction-bonded SiC composite suitable for braking applications, e.g., disk and pad, for motor vehicles, consisting of carbon fibers arranged isotropically and embedded in a matrix of 40–50 volume percent SiC and not more than 15 volume percent Si. The carbon fibers are protected from chemical reaction with the Si infiltrant by infiltrating a pitch resin into the mass of fibers prior to the Si infiltration step.

U.S. Pat. No. 4,944,904 to Singh et al. discloses a similar composite material system intended mostly for high temperature, aerospace applications, such as a turbine engine component, but also mentioning applications such as wear parts and acoustic parts. The matrix comprises at least 5 volume percent SiC but preferably at least 45 percent, and 1–30 volume percent Si but preferably 1–2 percent. The fibers may be carbon or SiC, but are not disclosed as being arranged isotropically or quasi-isotropically. The fibers similarly are protected from attack by the molten silicon, but here, the protective coating consists of boron nitride plus an overcoat of a silicon-wettable material such as carbon or metal carbides such as SiC. The BN also provides a debond layer so that the fibers can move relative to the matrix under mechanical loading, thereby providing a toughening aspect to the resulting composite body. Again, low CTE does not appear to be an express objective of either of these reaction-bonded SiC composite patents; however, the formed composites are expected to inherently possess a low CTE, as most of the constituents are low CTE materials.

OBJECTS OF THE INVENTION

Thus, in view of the present state of materials development, it is an object of the present invention to produce a metal-ceramic composite material that exhibits a low CTE, and particularly a near-zero CTE.

It is an object of the present invention to produce a material that can be engineered to exhibit isotropic or quasi-isotropic properties, at least with respect to CTE.

It is an object of the present invention to produce a material having a relatively high thermal conductivity.

It is an object of this invention to produce a material that can maintain its structural integrity at higher temperatures than can polymeric materials.

It is an object of this invention to produce a material that is more resistant to the effects of radiation than are polymers.

It is an object of this invention to produce low expansion composite materials that are tougher and/or more impact resistant that glass matrix composites.

SUMMARY OF THE INVENTION

These and other objects of the present invention are achieved by reinforcing a lightweight matrix comprising one or more metals or semimetals such as aluminum, magnesium, copper, silicon or one of their alloys, with a reinforcement material possessing a negative CTE. Among the materials having such a property are certain fibers, wherein the fiber has a negative CTE in the axial direction, i.e., parallel to the fiber axis. Because the CTE of the matrix is positive while that of the fibers is negative, the individual contributing CTE's tend to cancel one another. Because of this counterbalancing or offset effect, it is theoretically possible to engineer a metal matrix composite material, or a composite material of any matrix, for that matter, to have a net overall CTE of zero.

The inventors recognize, however, that the CTE of the composite body is also influenced by the elastic modulus of the individual composite constituents. Given the high CTE and elastic modulus of some candidate matrix metals, it is for all practical purposes impossible to achieve sufficiently high fiber loadings to counterbalance this "adverse influence" of such matrix metals, in spite of the fact that the negative CTE fibers usually also possess very high elastic modulus.

Significantly, the inventors appreciate that the lower the modulus of the matrix relative to the fibers, the more that the CTE of the composite is influenced by the CTE of the fibers. Accordingly, in a first major aspect of the invention, by introducing voids or porosity into the matrix, the elastic modulus of the matrix may be decreased, thereby shifting the composite CTE further toward that of the fibers. The important point is that the direction of the change in composite CTE is toward zero. One such technique for introducing such porosity is by dissolving hydrogen gas into a melt of the metal that is to be the matrix, and causing the gas to come out of solution as bubbles upon solidification of the metallic matrix. Another is to incorporate one or more filler materials comprising hollow bodies into the composite.

In a second major aspect of the invention, the inventors appreciate that having a matrix possessing a low CTE goes a long way to producing a composite having a low CTE overall. Si/SiC composites, e.g., those made by reactive infiltration of a melt of silicon into a mass containing carbon, intrinsically possess a relatively low CTE. For most of the prior applications, however, (e.g., high temperature applications) materials engineers tended to prefer composites having large fractions of SiC and low fractions of Si. The instant inventors, particularly in view of the above analysis regarding elastic modulus, instead prefer the contrary phase assemblage: high fractions of Si metal and low fractions of SiC. The instant inventors realize that, once is inherent brittleness is dealt with, silicon is actually a very desirable engineering material where low CTE is desired. Because the matrix already possesses a low CTE, the instant inventors have realized that composites can be produced that have CTE less than 2.7 (CTE of Si and SiC), provided that the CTE of the reinforcement is less than this amount. Thus, reinforcements having negative CTE, while still desirable, are not mandated by this aspect of the invention. Accordingly, low CTE composites can be produced using low cost carbon fibers having a zero or positive (although still quite low) CTE. Further, an isotropic or quasi-isotropic arrangement of the fibers, though still desirable in certain applications, is not mandated by this aspect of the invention. In this composite system, however, the carbon fibers need to be protected chemically from the molten silicon, and the present invention illustrates techniques for accomplishing same. Providing at least a degree of toughness or impact resistance can also be realized in these composites.

DETAILED DESCRIPTION OF THE INVENTION AND PREFERRED EMBODIMENTS

The overall theme of the instant invention can be characterized as that of designing and producing a metal-containing composite material featuring as the matrix phase lightweight metal or semimetal such as aluminum, magnesium, silicon or one of their alloys, or a high thermal conductivity metal or alloy thereof such as copper or silver, and featuring as the reinforcement phase a plurality of low CTE fibers, such as carbon fibers. Moreover, the composite system is engineered or biased such that the overall composite CTE is strongly influenced by the CTE of the fibers. In spite of the rather high CTE's of matrix metals such as aluminum and magnesium, such metals may be used as the matrix materials to produce low expansion composites. That this is so is because the inventors recognize that the overall CTE of the composite is affected not only by the respective CTE's of reinforcement and matrix phases and the volume fraction of each, but also by the respective elastic moduli. More specifically, the inventors appreciate that the lower the elastic modulus of the matrix relative to the fibers, the more that the CTE of the composite is dominated by the CTE of the fibers. The elastic modulus of the matrix may be engineered (e.g., decreased) by introducing voids or porosity into the matrix, thereby causing the overall CTE of the composite material to trend toward that of the fibers. High elastic modulus graphite fibers often have a negative CTE along the fiber axis. This phenomenon is significant because the direction of this trend is toward zero net CTE. One such technique for introducing such porosity is by dissolving hydrogen gas into a melt of the metal that is to be the matrix, and causing the gas to come out of solution as bubbles upon solidification of the metallic matrix. Alternatively, hollow bodies may be incorporated into the composite as space-occupying filler material.

Reference to FIGS. 1 through 4 will help explain how the CTE of a composite material is influenced by the contributions of the CTE and elastic moduli of the reinforcement and matrix components of the composite. Table I below reports the data upon which the CTE curves were calculated.

TABLE I

| Property | K13710 Carbon Fiber | Al-20% Si Alloy | Si-20% Al Alloy | Si | Mg Alloy |
|---|---|---|---|---|---|
| Elastic Modulus, $E_{11}$ (GPa) | 615 | 73 | 100 | 110 | 45 |
| Elastic Modulus, $E_{22}$ (GPa) | 7.7 | | | | |
| Poisson's Ratio, $v_{12}$ | 0.27 | 0.3 | 0.3 | 0.3 | 0.3 |
| Poisson's Ratio, $v_{23}$ | 0.4 | | | | |
| Shear Modulus, $G_{12}$ (GPa) | 30 | 28 | 38 | 42 | 17 |
| CTE, $\alpha_1$ (ppm/K) | −1.38 | 20 | 7 | 2.6 | 26 |
| CTE, $\alpha_2$ (ppm/K) | 9 | | | | |

Figure 1:
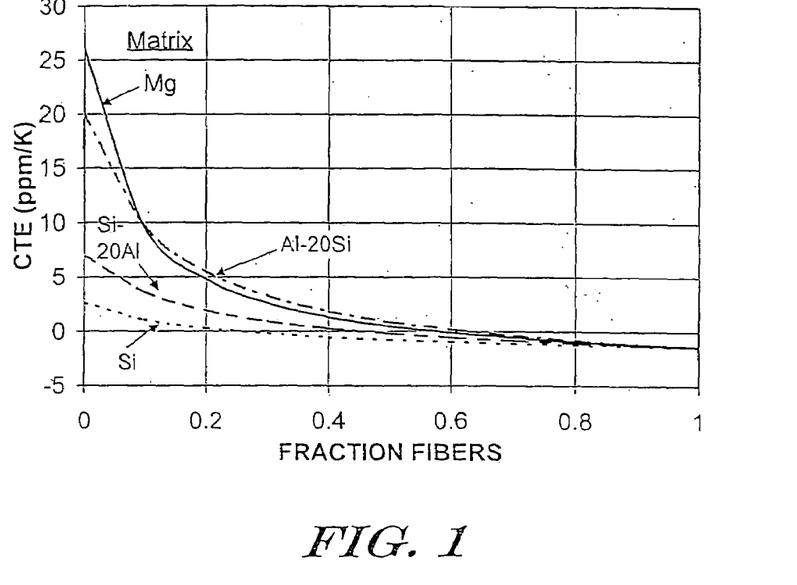
FIG. 1 is a plot of composite CTE as a function of unidirectional high modulus graphite fiber content and various matrix metals.

FIG. 1 shows calculated composite CTE values for four matrix metals as a function of fiber loading. Here, the matrix materials are considered to be substantially pure magnesium, silicon, and two aluminum-silicon alloys: Al-20Si and Si-20Al. The reinforcement is taken to be high modulus graphite fibers having a CTE of about negative 1.38 ppm/K in the direction of the fiber longitudinal axis. Here the modulus of the fiber component is about 615 GPa; however, a modulus of about 300 GPa would still be considered "high modulus." These curves reflect the case where the fibers are parallel to one another, and the composite CTE is that measured in the fiber axis direction. In this parallel fiber arrangement, the negative CTE of the fibers has a powerful "counterbalancing" effect on the (very) positive CTE of the matrix. Composite CTE values at or below about 3 ppm/K can be realized at relatively low volume fractions of fibers, for example, as low as 30 percent.

Equation 1 shows the mathematical relationship among CTE, elastic modulus, and volume fraction that is expressed by the curves in FIG. 1.

$$\text{Equation 1:} \quad \alpha_{11} = \frac{V \cdot E_{11f} \cdot \alpha_{1f} + (1-V)E_m \cdot \alpha_m}{V \cdot E_{11f} + (1-V) \cdot E_m}$$

where:
- V is the volume fraction of fibers;
- $E_m$ is the elastic modulus of the matrix;
- $E_{11f}$ If is the elastic modulus of the fibers in the axial direction;
- $\alpha_{1f}$ is the CTE of the fibers in the axial direction;
- $\alpha_m$ m is the CTE of the matrix; and
- $\alpha_{11}$ is the CTE of the composite body in the fiber axial direction.

Obviously, the larger the contributing CTE's of reinforcement and matrix, the larger the overall CTE of the composite. As Equation 1 also demonstrates, however, the CTE of the composite is related to the elastic moduli of the matrix and reinforcement phases. Moreover, this equation shows that reducing the modulus of the matrix relative to the modulus of the reinforcement reduces the CTE contribution of the matrix to the overall composite CTE, therefore causing the composite CTE to trend toward the CTE of the reinforcement. Because the CTE of the high modulus carbon fibers is negative (at least in the axial direction) while that of the matrix is positive, the averaging of the two to yield the CTE of the composite tends to produce a CTE "cancellation". Thus, it is at least theoretically possible with a proper balancing of CTE's to engineer the overall CTE of the composite to be zero.

One must bear in mind, though, that the situation described immediately above and in FIG. 1 represents the case in which the fibers are aligned. Such a composite would be highly anisotropic, and the composite CTE would be zero or near-zero only in the direction parallel to the fiber axes. In other directions, the overall CTE of the composite body would be positive and large.

An arrangement of the fibrous reinforcement that leads to a more (but not completely) isotropic composite body is the so-called "quasi-isotropic" arrangement whereby the objective is to achieve isotropy within a plane. A quasi-isotropic condition can be achieved, or at least approximated, by organizing the reinforcement fibers into sheets or "plies", and stacking the plies flat atop one another. Within each ply the axes of the fibers may be randomly arranged. In the alternative, the fibers are arranged unidirectionally within each ply, but then as the plies are placed atop one another, they are oriented such that the fibers in adjacent plies lie at specific angles with respect to one another.

Quasi-isotropic composites are similarly affected by the properties of the constituents. One major difference from the parallel fiber case, however, is in the degree of the offsetting CTE effect of the fibers, as will be evident from FIG. 2.

Figure 2:
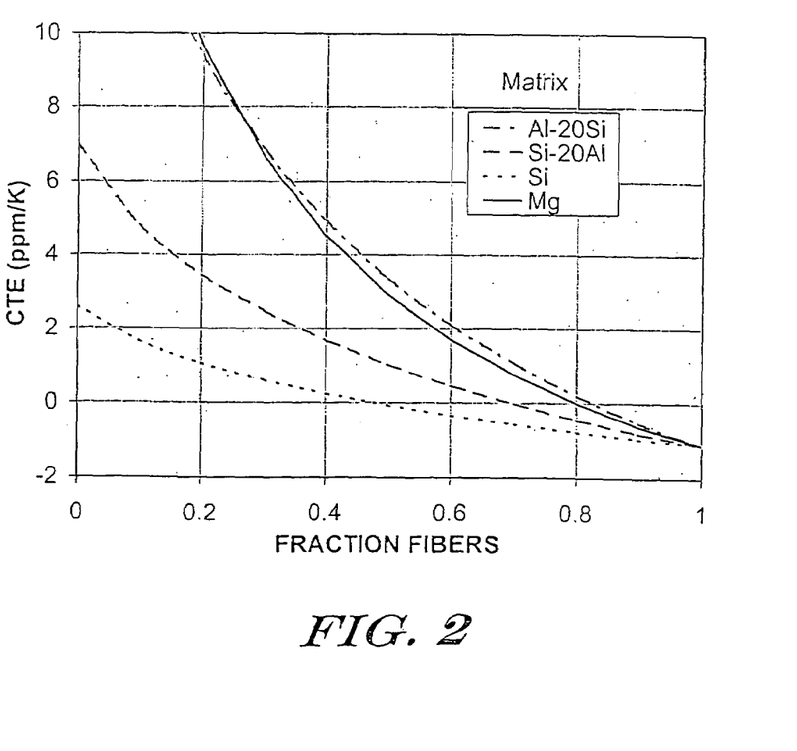
FIG. 2 is a plot of composite CTE for the same matrix metals as in FIG. 1 and as a function of fiber content in a quasi-isotropic arrangement.

Referring now to FIG. 2, what is illustrated is the case where the fibers are considered to be quasi-isotropic as, for example, by orienting successive plies of parallel fibers at 0°, +45°, -45° and 90°; or 0°, +60°, -60° with respect to one another. In this condition, the composite CTE will be approximately isotropic in the plane of the plies, but will be different (and larger) for directions not in the plane. Inspection of FIG. 2 shows that the overall CTE's of the composite body are substantially higher for the same fiber loading than in the case of unidirectional reinforcement. Stated another way, in the quasi-isotropic case, it requires a much higher fiber loading to achieve the same composite CTE than it does in the anisotropic, unidirectional case. However, the CTE's of the composite body still can be substantially lower than those of the matrix materials themselves.

The inventors appreciate that CTE itself varies as a function of temperature. Accordingly, to be most precise when stating a CTE value, the temperature or temperature range should also be specified. In the present patent document, CTE values should be assumed to pertain to the temperature range of 0 to 100° C. unless otherwise indicated.

The inventors furthermore appreciate that the terms "lower" and "higher" are rather subjective. In the context of the present invention, what is meant by a "low" CTE metal matrix composite body is one having a linear thermal expansion coefficient in the 0 to 100° C. range that is not significantly greater than about 3 or 4 ppm/K. As far as most unreinforced metals are concerned, this CTE is quite low. In the context of the present invention, materials having absolute value of CTE of about 1.0 ppm/K or less are considered "near-zero" CTE materials. There are applications that would benefit from metal composites having even lower CTE's, such as in optical components for measurement such as laser mirrors, as well as in high precision motion control systems such as for wafer and reticle motion control in semiconductor lithography. Specifically, the semiconductor manufacturing equipment industry has a need for materials whose absolute value of CTE is no greater than about 0.2 ppm/K.

In actual practice, however, zero or near-zero composite CTE is difficult if not impossible to achieve (at least in the quasi-isotropic case) using unmodified metals as the matrix material, particularly high CTE metals such as aluminum or magnesium. Referring again to the Table, one can gain a sense of why such a high fiber loading would be required where the CTE of the matrix metal is on the order of 20 ppm/K or more, and that of the graphite fibers is only on the order of -1 to -2 ppm/K. A review of FIG. 2 bears this fact out, showing that fiber loadings in excess of 70 volume percent would be required to achieve a composite CTE of 1 ppm/K or less where the matrix is magnesium or aluminum/ 20 wt % silicon.

A review of Equation 1 can provide an approach for reducing the influence of matrix materials such as metals whose CTE may overwhelm the CTE of the fibers. Specifically, if the elastic modulus of the matrix can be reduced relative to that of the fibers, then the CTE of the composite will be less influenced by the matrix contribution, and more dominated by the fiber contribution.

One strategy for reducing the elastic modulus of the matrix is to select only relatively low elastic materials as candidate matrix materials, e.g., polymers. This approach, however, excludes many materials that might otherwise possess desirable properties, for example, high thermal conductivity metals such as aluminum.

A better approach might be to work with the desired matrix metal, and find ways to reduce its elastic modulus. One such technique, representing a first major aspect of the invention, is to introduce pores or voids into the material making up the matrix. Preferably, the pores are closed so as not to expose the interior of the composite material to potentially corrosive external environments. Closed pores would also not inhibit evacuation in vacuum environments. The pores should be small and uniformly distributed throughout the matrix.

Figure 3:
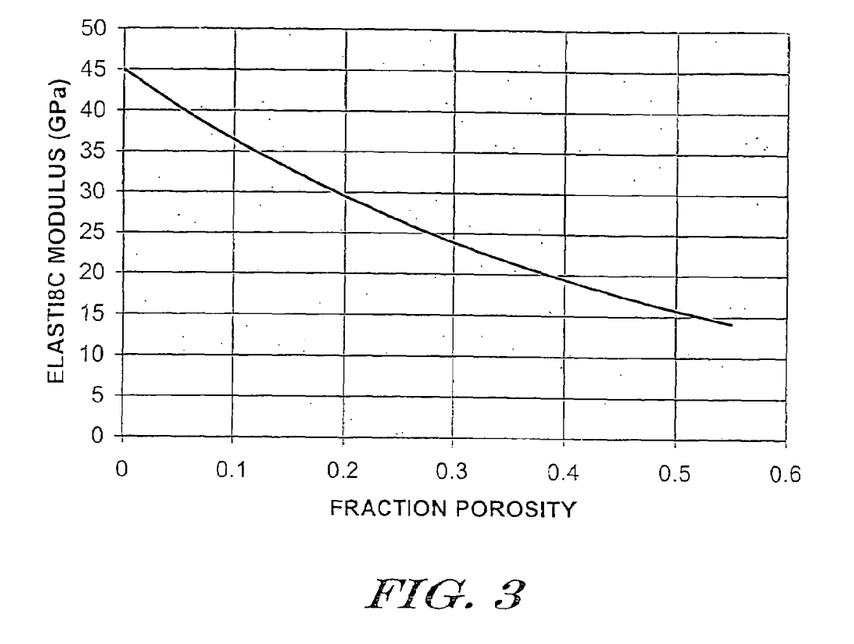
FIG. 3 is a plot of elastic modulus as a function of porosity for magnesium.

FIG. 3 is a plot of the mathematical relationship between porosity and the physical property of elastic modulus. Here, the material being presented is magnesium, but the relationship holds for any isotropic material. This graph assumes closed, spherical pores evenly distributed throughout the body. To take one point as an example, one can see that 33 percent porosity reduces the elastic modulus by about 50 percent. For flatter pores, the effect is even greater. Equation 2 illustrates the more comprehensive mathematical relationship among the pore-free elastic modulus $E_o$, pore fraction $f_p$, pore shape coefficient b, and the resulting elastic modulus E.

$$E = E_O \exp(-b\, f_p) \qquad \text{Equation 2}$$

Figure 4:
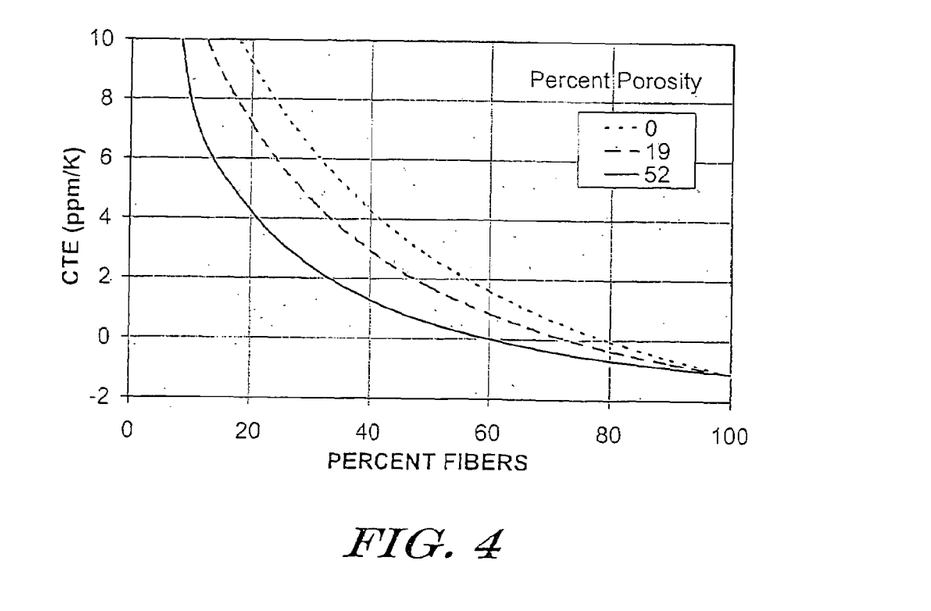
FIG. 4 is a plot of composite CTE as a function of fiber content for various degrees of porosity in quasi-isotropic magnesium matrix composite.

FIG. 4 shows the effect of this porosity on the composite CTE curves as a function of high modulus carbon fiber content (in the quasi-isotropic arrangement) with magnesium as the matrix. At 50 volume percent fiber loading and no porosity, the composite CTE is about 3 ppm/K. Introducing about 19 percent porosity into the matrix brings the composite CTE to below 2 ppm/K. If 60 percent loading can be achieved, a 52 percent porous matrix will yield a magnesium matrix composite body having essentially zero CTE. This result is rather remarkable given that the CTE of unreinforced magnesium is about 26 ppm/K.

There are a number of ways to intentionally introduce pores into the matrix material. For example, the composite may be processed using powder metallurgical techniques. More specifically, the matrix may be added to the fibers or placed between fiber plies in finely divided form (e.g., as a powder), and the admixture incompletely sintered to produce a porous, reticulated matrix. Additionally, one or more fugitive materials may be added to the finely divided matrix metal prior to sintering such that during subsequent heating and partial sintering, the fugitive material burns out or volatilizes, and each body of fugitive material leaves behind a pore.

For metal matrix composite materials made by infiltrating molten metal into a porous, metal permeable body of reinforcement material, the propensity for dissolved gasses to come out of solution and create bubbles upon solidification of the metal may be employed to advantage. One such gas that exhibits this characteristic, particularly with aluminum melts, is hydrogen. In fact, hydrogen is normally thought of as a nuisance substance in aluminum casting procedures, and foundry workers usually take precautions (e.g., vacuum degassing) to avoid hydrogen entrapment in their melts to be cast. In certain applications, a little hydrogen may be beneficial, for example, by reducing somewhat the amount of solidification shrinkage of an aluminum casting. The hydrogen contamination typically arises from exposure to water vapor, and merely exposing a melt of aluminum to an ambient, moist air atmosphere for any appreciable amount of time will result in the uptake of hydrogen by the melt. Where hydrogen gas is to be added deliberately to an aluminum melt, the traditional approach was to add a slice of apple or potato to the molten metal. Those familiar with modern aluminum foundry techniques are aware of commercially available metal treatment products for this purpose.

Still further, pores may be incorporated into the matrix by infiltrating the molten matrix metal into a permeable mass or preform containing the graphite fibers and hollow bodies of filler material such as alumina "microspheres." In one embodiment, the high modulus graphite fibers are arranged quasi-isotropically, and the assemblage of fibers is then constrained or clamped around the periphery thereof, as for example, by a refractory frame structure. This assembly is then immersed into a slurry containing the microspheres, thereby depositing microspheres between the fibers. After thoroughly drying the liquid vehicle of the slurry, molten matrix metal is then caused to infiltrate the permeable mass, thereby embedding both the graphite fibers and the alumina microspheres.

The ideal candidate molten metal would wet but not react with the carbon fibers. Unfortunately, this is not generally the situation with many of the candidate metals of interest. Thus, another choice of a matrix metal is one that, while not wetting the reinforcement, at least does not react with the fibers. Then, while the application of pressure or vacuum may be required to distribute the metal among the fibers to form a composite body, at least the fibers are not chemically degraded by the metallic matrix. Pressure infiltration techniques, while cumbersome and costly, at least are well-known and widely practiced in the metal composites art.

While some high thermal conductivity candidate matrix metals do not react with carbon (e.g., magnesium and copper), other metals such as silicon and aluminum do react. (Strictly speaking, silicon is a semimetal or "metalloid", but in the context of the present invention, silicon will be considered a metal.) Aluminum, for example, reacts with carbon to form aluminum carbide. Not only does this represent a chemical degradation of the graphite reinforcement fibers, but also aluminum carbide is hygroscopic. The chemical conversion of aluminum carbide to aluminum hydrate from exposure to water (such as water vapor) produces acetylene gas plus a large positive volume change that can cause cracking in the composite body.

Therefore, one or more coatings may be placed onto the carbon fibers to protect the fibers from being corroded by these reactive matrix metals. Sometimes, coatings can be found that also permit the infiltrant metal (e.g., aluminum) to wet the reinforcement better. Wetting of the metal to the reinforcement may improve the mechanical properties of the resulting metal composite, and the wetting condition may also permit the metal to infiltrate a porous mass of the reinforcement material without the need to force the molten metal in under pressure, or to pull it in under applied vacuum. For silicon or silicon alloy melts, a desirable additional coating is silicon carbide, and a widely known technique for depositing a coating of silicon carbide onto carbon fibers is by chemical vapor deposition (CVD).

The instant inventors have taken a renewed interest in silicon as a candidate matrix metal for metal-ceramic composites for reasons that will be discussed below, and the advantages of silicon may make worthwhile the extra effort and expense of coating the carbon fibers.

Recently, the inventors have focused particular attention on silicon as a candidate matrix metal, and to engineer composite materials having a silicon-containing matrix to overcome some of the shortcomings of silicon, such as its inherent brittleness, as well as its propensity to react with the carbon fibers. One of the reasons that the inventors have taken a renewed interest in silicon as a candidate matrix metal is their appreciation that when the matrix of the composite material already possesses a relatively low CTE, the objective of achieving a composite having low overall CTE is easier, and thus may not require techniques to reduce the elastic modulus of the matrix, e.g., by introducing porosity. In fact, low CTE composite materials can be produced without the need for reinforcements having a negative CTE. This represents the second major aspect of the invention.

Another technique for protecting the carbon fibers when the infiltrant comprises silicon is to coat the fibers with additional carbon prior to infiltration. Carbonaceous materials such as pitch, phenolic resin, furfural alcohol, epoxy resin, etc. are popular choices in this regard, and in fact, some suppliers to carbon fibers and fabrics sell their products in this coated condition. The composite system furthermore can be engineered such that not all of the added carbon reacts to form SiC. The residual carbon then can serve to permit some movement in the axial direction of the fibers relative to the matrix, e.g., serve as a fiber debond layer, should such behavior be desirable. A metal-ceramic composite whose matrix is based on silicon typically is brittle, and accordingly, fibrous reinforcement having debond coatings thereon for toughening is generally desirable.

In view of the observation that silicon wets silicon carbide coatings, the instant inventors have found that a very desirable technique for producing metal-ceramic composites whose matrix is based on silicon is by way of an infiltration technique, specifically by siliconizing or by a reactive-infiltration process. For example, molten silicon can spontaneously wick into a porous mass of silicon carbide without the need to draw the molten silicon in under vacuum or to force it in under pressure. The infiltration works best in a vacuum atmosphere and when the permeable mass contains some elemental carbon that is available to react chemically with the molten silicon.

Over the years, there has been a significant amount of work directed to reinforcing SiC composites, e.g., reaction-bonded SiC composites, with carbon fibers. See, for example, U.S. Pat. Nos. 4,118,894; 4,944,904 and 6,248,269. Because the matrices of these composite materials consist of low CTE substances, i.e., SiC, typically interconnected, and typically also some residual, unreacted Si, also typically interconnected, the resulting composite bodies are expected to inherently feature a low CTE. However, those inventors typically state high temperature applications as their objective, and therefore each tends to recommend that the matrix phase contain minimal unreacted Si phase. In general, those inventors do not expressly state low CTE as one of their objectives. Although SiC is a low CTE material, for reasons that will be developed in more detail to follow, for many applications of the present invention, what is desired is to minimize the in-situ SiC phase and to maximize the Si or Si alloy phase. (The reader should note, however, that there is nothing intrinsic to the instant invention that prevents the production of composites containing high fractions of in-situ SiC, if one wants that.) Accordingly, the instant inventors employ silicon reactive technology to produce Si/SiC matrix composites, but they focus on producing composites whose matrices are high in Si metal and low in SiC. To this end, in one embodiment of the instant invention, a carbon fiber reinforced, reaction-bonded SiC composite body was produced containing less than about 10 volume percent of SiC made in-situ.

It appears that most of the interest in Si/SiC composites is directed toward maximizing the amount of SiC, and minimizing the amount of Si. There seemed to be comparatively little prior interest in producing silicon matrix composites. Again, where composites have been made by the reactive infiltration of silicon into a preform containing carbon to produce silicon carbide, the objective usually has been to maximize the amount of SiC and to minimize the amount of Si, e.g., for refractory applications. Where a metal matrix composite has been the objective, the prior investigators tended to find reasons to avoid silicon in favor of other, tougher metals. However, not all applications of MMCs require toughness. Nevertheless, where some degree of toughness is required, there are techniques for increasing toughness, e.g., fiber debonding or alloy modifications to the matrix phase.

Accordingly, a silicon matrix composite material has many desirable features, and should not be overlooked or dismissed. For example, at about 2.7 ppm/K, silicon possesses a low coefficient of thermal expansion, and its thermal conductivity is relatively high at about 151 W/m K. Silicon carbide also possesses these properties, but as a candidate matrix material, silicon possesses a number of advantages over silicon carbide. Again, where a composite material is to be reinforced with negative CTE fibers, the lower elastic modulus of Si compared to that of SiC serves to shift the composite CTE toward that of the fibers, e.g., to further reduce composite CTE. Further, and not specifically applying only to composites having negative CTE reinforcement, silicon is machinable by electrodischarge machining (EDM), whereas silicon carbide is not. Moreover, some applications such as certain components in a semiconductor lithography machine, are required to be coated, such as by plating, and in this regard, silicon is easier to plate than is silicon carbide, i.e., electroplating requires electrical conductivity. Still further, silicon possesses a slight advantage over silicon carbide in the sense that its CTE is lower, and its toughness is higher.

Many of the applications contemplated by the instant invention function at ambient temperature, or close thereto. Silicon is brittle at such temperatures. Thus, unlike the situation where the matrix is tough (as it is inherently with most metals), it may be necessary to provide a toughening mechanism to the instant Si matrix composites. One way is the technique commonly employed in CMC's—namely to cause the fibers to debond from the matrix under applied load, or at least to be able to move axially with respect to the matrix under the influence of an applied load. This technique is commonly achieved with a debond layer such as carbon (e.g., pyrolytic carbon) or boron nitride applied to the fibers. However, with Si/SiC composite systems, such coatings are often reactive with the molten Si infiltrant, typically resulting in the loss of the debonding property, or are not wetted by molten Si, thus preventing infiltration. However, since it was stated earlier that the carbon fiber reinforcement itself is reactive with many of the candidate matrix metals and thus needs to be protected, for example, with a coating, the debond coating may be located between the carbon fiber and the protective coating such that the protective coating may protect both carbon fiber and debond coating. Both the protective coating and the debond coating can be applied or deposited by chemical vapor deposition (CVD). U.S. Pat. No. 5,015,540 discloses such a multiple fiber coating system. It bears noting that since carbon was earlier identified as a candidate protective coating, under the proper conditions it is possible that a single material, e.g., carbon, can serve the dual role of acting to chemically protect the underlying fiber, as well as acting as the debond material for toughening purposes.

Another technique for enhancing the toughness of the Si-based matrix composites is to enhance the toughness of the matrix, e.g., by alloying the silicon. Commonly Owned U.S. Provisional Patent Application No. 60/145,299 discloses that aluminum may be alloyed with the silicon in amounts ranging from about 0.1 percent by weight or less up to about 90 percent. The resulting alloy will still pressurelessly infiltrate into a permeable mass of reinforcement material containing some interconnected carbon to form a reaction bonded silicon carbide composite body. The alloy generally does not need to be heated to a temperature greater than about 100° C. above its liquidus temperature. If the body to be infiltrated contains no elemental carbon, however, the process may have to be carried out at higher temperatures, for example, in the 1600° C. to 1800° C. range. The entire disclosure of this Commonly Owned Patent Application is hereby incorporated by reference.

Accordingly, in a first preferred embodiment of the second aspect of the instant invention, carbon fibers are coated with a plurality of coatings, at least one of the coatings being a debond coating such as boron nitride, which is then followed by a coating that is protective of the debond coating, such as silicon carbide. These ceramic coatings can substantially rigidize the fibers, so sometimes it is necessary to organize the arrangement or geometry of the fibers into the desired bulk shape, e.g., a preform, prior to the fiber coating process. A reactable source of carbon such as carbon paint is then supplied to the arranged fibers, generally no more than about 10 percent by weight, to complete the preform. The preform optionally may be green machined. Upon pyrolysis of the carbon source, the preform is contacted with a source of molten silicon metal or alloy, which soaks into the porous preform, assisted by chemical reaction of the molten silicon with the supplied reactable carbon. Solidification of the infiltrated silicon or alloy yields a composite body.

In a second preferred embodiment of this second aspect of the invention, the protective layer or coating comprises carbon itself, although typically of a different form than the carbon fibers. The carbon coating is provided sufficiently thickly that it can be thought of as forming part of the matrix phase; thus, these preforms are sometimes referred to as carbon/carbon composites. One means of accomplishing this carbon addition to the carbon fiber preform is to soak the preform in a carbonaceous resin such as furfuryl alcohol, then pyrolyze the resin in a non-oxidizing atmosphere to decompose the resin to essentially elemental carbon. Upon contact with the molten silicon or its alloy, the latter can infiltrate the porous carbon/carbon composite, and the silicon reacts with at least a portion (generally only a portion when done correctly) of the carbon matrix to form at least some SiC in the matrix, along with residual Si or Si alloy. Ideally, the carbon fibers are protected from the molten silicon by the carbon matrix, thereby leaving a composite body comprising carbon fibers and a matrix comprising SiC, Si (alloy) and usually also some residual carbon, mostly at the interface between the carbon fibers and the Si/SiC matrix. The residual carbon coating also provides for toughening of the composite material by making a weak bond with the Si/SiC matrix, thereby permitting movement of the carbon fiber relative to the matrix upon application of mechanical stress.

Porous preforms of the carbon fibers already embedded in pyrolyzed carbon matrices are commercially available, and are typically supplied as so-called "zero stage" carbon/carbon composites. More specifically, the carbon fibers are supplied in a fixed arrangement in a carbonaceous matrix, such as epoxy. The carbon/carbon composite typically is supplied as a ply or sheet, with the carbon fibers lying in the plane of the sheet. The fibers may be highly organized, as in a woven structure, or may be randomly arranged as in a mat. The carbon/carbon composite is supplied in a porous condition, or at least develops pores upon pyrolysis of the carbon matrix. Upon contact with the molten silicon or its alloy, the latter can infiltrate the porous carbon/carbon composite, and the silicon reacts with at least a portion (generally only a portion) of the carbon matrix to form at least some SiC in the matrix, along with residual Si or Si alloy. Ideally, the carbon fibers are protected from the molten silicon by the carbon matrix, thereby leaving a composite body comprising carbon fibers and a matrix comprising SiC, Si (alloy) and usually also some residual carbon, often in the form of a zone of carbon disposed between the fibers and the matrix.

Engineering the composite body such that at least some carbon remains unreacted by silicon can be accomplished through attention to, and control of, factors such as the relative amounts of (volumetric loading) reactable carbon and filler, the type or form of the carbon, the relative amount of infiltrant provided, the time required for infiltration and the processing temperature during infiltration. Factors that are conducive to the intentional incomplete reaction of the supplied carbon include supplying relatively large quantities of carbon to the preform, using sources of carbon that have a high char yield such as furfuryl or phenolic resins, and minimizing processing time and temperature.

In a third preferred embodiment of the second aspect of the invention, the carbon fibers may be protected by the pyrolysis product of a silicon-containing polymer such as a polysilazane. Specifically, the carbon fibers or cloth can be coated by a polysilazane resin (e.g., by spray coating or infiltrating resin into the fiber bundles, or by dipping the fibers into bulk resin). The preform is then assembled and pyrolyzed, leaving a silicon-containing coating on the carbon fibers, which coating may include SiC. If green machining is desired, it may be performed at this point. The preform may then be infiltrated with a reactable carbon source such as the carbon paint. Upon pyrolyzing the reactable carbon source, the preform is reactively infiltrated as before with the silicon or silicon alloy to yield a composite body comprising carbon fibers having a SiC coating, and a matrix comprising Si (or alloy) and at least some in-situ SiC.

The following examples illustrate with still more specificity several preferred embodiments of the present invention. These examples are meant to be illustrative in nature and should not be construed as limiting the scope of the invention.

EXAMPLE I

This example demonstrates how a high modulus graphite fiber reinforced magnesium composite might be produced according to the present invention.

Plies of parallel graphite fibers are supplied as "prepregs."

In accordance with the teachings of U.S. Pat. No. 3,888,661 to Levitt, the plies are then "dusted" with titanium metal particulate having an average particle size of about 44 microns. During subsequent processing, the titanium will help the magnesium to wet and bond to the graphite fibers. In addition, as the fiber plies are assembled, each ply is "salted" with a layer of magnesium filings.

The plies are then arranged quasi-isotropically in a refractory mold. In particular, if the orientation of the first ply is taken to be 0°, then the second ply is placed flat on top of the first ply such that it is oriented +45° with respect to the first ply. The third ply is then placed flat on top of the second ply and oriented −45° with respect to the first ply. The fourth and fifth plies are then placed flat on top of the third ply and oriented +90° with respect to the first ply. The sixth ply is then placed flat on top of the fourth ply and oriented −45° with respect to the first ply. The seventh ply is placed flat on top of the fifth ply and oriented +45° with respect to the first ply. Finally, the eighth ply is placed flat on top of the sixth ply and oriented in parallel (0°) with respect to the first ply, thereby completing the lay-up.

The temporary binder holding the graphite fibers in fixed relation to one another is then removed by dissolving in an organic solvent such as acetone or methylethyl ketone.

After drying to remove all traces of the solvent, the lay-up is then contacted with a source of molten magnesium at a temperature in the range of about 725° C. to about 800° C. in an inert gas atmosphere. The magnesium previously has been inoculated with hydrogen. No more than modest pressure (e.g., less than 700 kPa) should be needed to cause the molten magnesium to infiltrate the carbon fiber plies.

Upon completion of infiltration, the magnesium matrix composite body is solidified in a controlled manner so as to cause the dissolved hydrogen to come out of solution as tiny hydrogen gas bubbles. In particular, the composite body should be solidified omnidirectionally with slow cooling through the melting temperature.

EXAMPLE II

The procedures of Example 1 are repeated, except that the teachings of U.S. Pat. No. 4,056,874 to Kalnin should obviate the need for adding magnesium filings and titanium particulate wetting agent between the fiber plies. Instead, about 5 to 10 percent by weight of magnesium nitride is added to the magnesium melt, thereby permitting the molten magnesium to wet and infiltrate the carbon fibers on contact in a gaseous nitrogen atmosphere. Such a melt can be obtained by exposing a crucible of molten magnesium at a temperature of about 840 to 850° C. to an atmosphere of gaseous nitrogen for about 40 minutes. Magnesium nitride solid will form on the surface of the melt, and this reaction product then may be readily dispersed in the magnesium melt.

EXAMPLE III

A quasi-isotropic lay-up is assembled as in Example 1, but without the magnesium filings or titanium particulate. After removing the temporary binder, a protective coating of silicon carbide is deposited onto the graphite fibers, for example, by chemical vapor deposition, thereby completing the lay-up. The lay-up is placed into a vacuum furnace. The furnace chamber is evacuated to less than about 100 millitorr, and heated to a temperature of about 1300° C. Upon contacting the coated fibers with a matrix metal comprising about Si-50Al, the molten metal is spontaneously wicked into the mass of coated fibers to form a composite body.

EXAMPLE IV

Sample A

This Example illustrates the fabrication of a carbon fiber reinforced silicon composite using a reactive infiltration technique.

A number of plies consisting of woven carbon fiber cloth (Grade T300 carbon fiber, approx 1000 fibers/tow, plain weave, BP Amoco, Greenville, S.C.) are stacked to a desired extent and affixed to one another using a low-residue binder. The assembly of bound carbon cloth plies is then coated with boron nitride, followed by silicon carbide (Honeywell Advanced Composites, Inc., Newark, Del.) under conditions designed to achieve uniform coating thickness in various regions of the laminate. Each of the BN and SiC coatings were deposited to a thickness of about 0.5 to 1.0 micron.

A piece of coated laminate measuring about 2 inches (51 mm) square by about 0.125 inch (3 mm) thick was immersed into a pool of carbon paint (Graphokote 120, Dixon, Inc.). A rough vacuum was applied, and after about 5 minutes, the piece was removed from the pool of paint, excess paint was removed from the surface, the piece was then placed onto a Teflon sheet, and allowed to dry in vacuum for about 5 minutes.

To effect infiltration, the coated laminate was placed into a BN coated crucible contained within a graphite chamber. About 4–5 grams of commercially pure (0.5 wt % Fe max) silicon metal in lump form (Elkem Metals, Pittsburgh, Pa.) was spread over the surface of the square plate. The furnace was evacuated, and then the temperature within the chamber was raised from about ambient to a temperature of about 1350 C at a rate of about 100 C per hour. After maintaining a temperature of about 1350 C for about 1 hour, the temperature was raised to a temperature of about 1425 C at a rate of about 50 C per hour. After maintaining a temperature of about 1425 C for about 15 minutes, the temperature was reduced at a rate of about 200 C per hour until the furnace could safely be let back up to atmospheric pressure and the infiltrated laminate recovered from the graphite chamber.

Figure 5A:
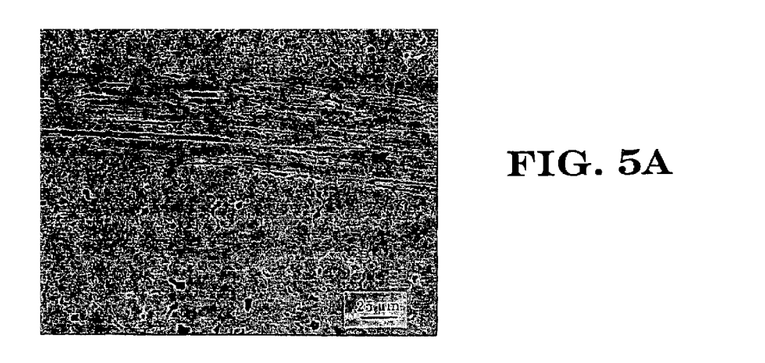
FIG. 5A is an optical photomicrograph of a polished cross-section of the composite body of Example IV, Sample A, and specifically in a region where two fibers plies cross one another.
Figure 5B:
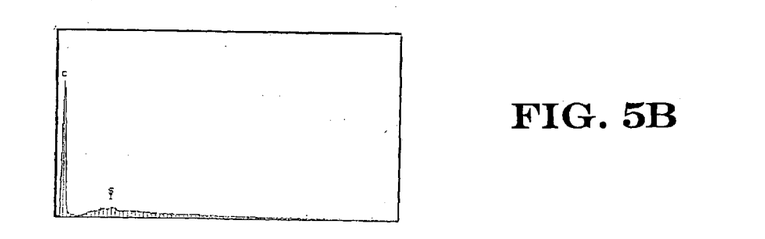
FIG. 5B is an EDAX pattern from the fiber area of the composite body of Example IV.
Figure 5C:
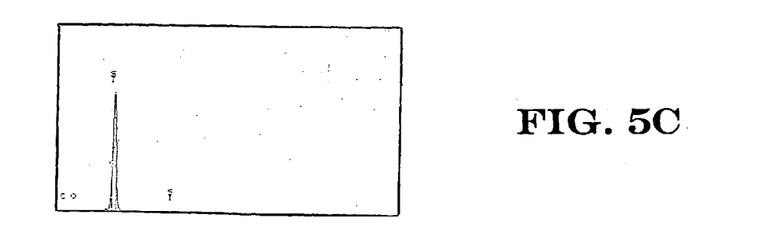
FIG. 5C is an EDAX pattern from the matrix area of the composite body of Example IV.

FIG. 5a is an optical photomicrograph of a polished cross-section of the resulting composite body, specifically in a region where two fiber plies cross one another. The SiC coating on the carbon fibers is clearly seen, as is the silicon matrix. A slight amount of SiC is also formed in-situ from reaction of the molten silicon infiltrant with the carbon paint. Among the significant features of the photo is that the carbon fibers were well protected from potential chemical reaction with the molten silicon during infiltration. This is supported by the EDAX (energy dispersive analysis by x-ray) patterns for the fiber and matrix shown in FIGS. 5b and 5c, respectively. Specifically, the EDAX pattern for the carbon fiber shows a large carbon peak, and a very small silicon peak. If the fibers had reacted with the silicon infiltrant, the EDAX pattern would have shown a much larger Si peak. Similarly, the EDAX pattern for the matrix shown in FIG. 5c indicates that the matrix is either silicon or silicon carbide, but not free carbon This result is confirmed by optical microscopy observations showing different gray levels for C, SiC and Si phases. An approximately 1 micron thick layer of SiC is observed surrounding the C fibers, divided roughly equally between that deposited by CVI and that deposited in-situ during reactive infiltration of the molten silicon. The formed composite body consisted of about 35 vol % C fibers, about 10–20 vol % SiC, and about 45–55 vol % Si-containing matrix phase.

Sample B

The technique of Sample A was substantially repeated, except that the carbon fiber was Grade EWC-600 from BP Amoco Polymers, Alpharetta, Ga. The formed composite body consisted of about 25–30 vol % C fibers, about 40–45 vol % SiC, and about 25–35 vol % Si-containing matrix phase.

EXAMPLE V

This Example demonstrates another approach to the fabrication of a carbon fiber reinforced silicon composite body.

A carbon/carbon composite (CCAT, Ft. Worth, Tex.) consisting of a plurality of layers of Grade T-300 (BP Amoco) or Grade EWC-600 (BP Amoco Polymers, Alpharetta, Ga.) carbon fiber cloths in a phenolic resin (Grade SC-1008, Borden Chemical, Louisville, Ky.) was pyrolyzed in a non-oxidizing atmosphere at a temperature of about 900 C to produce a zero-stage composite body. The zero-stage body typically contains about 35–50 volume percent fibers, about 20–30 percent carbon matrix and about 20–30 percent porosity, and is typically about 0.155 inch (3.9 mm) thick.

Figure 6A:
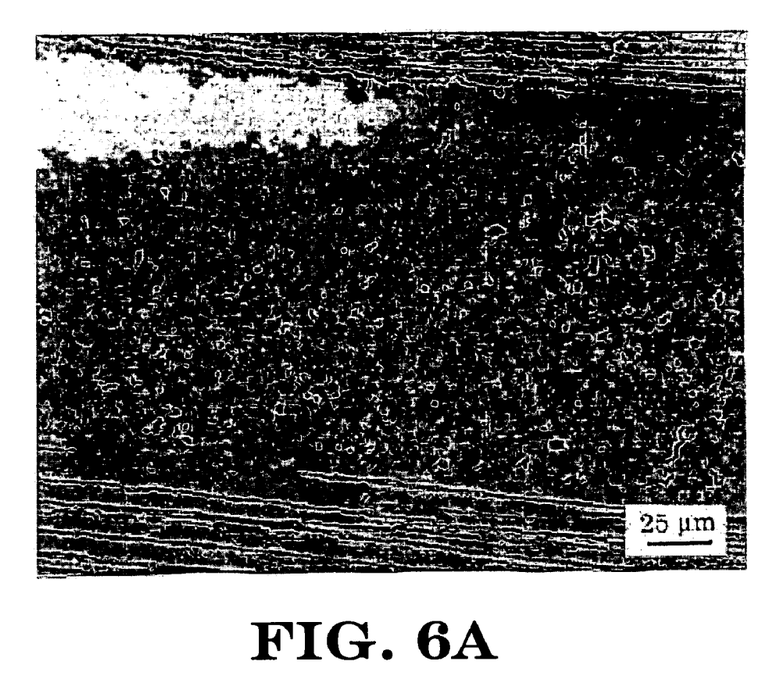
FIG. 6A is an optical photomicrograph of the formed composite body of Example V.
Figure 6B:
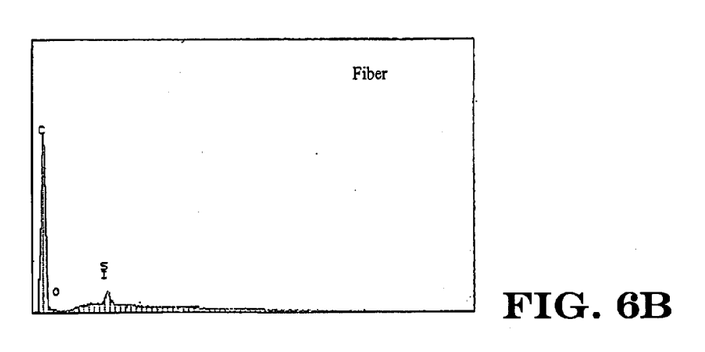
FIG. 6B is an EDAX pattern from the fiber area of the composite body of Example V.
Figure 6C:
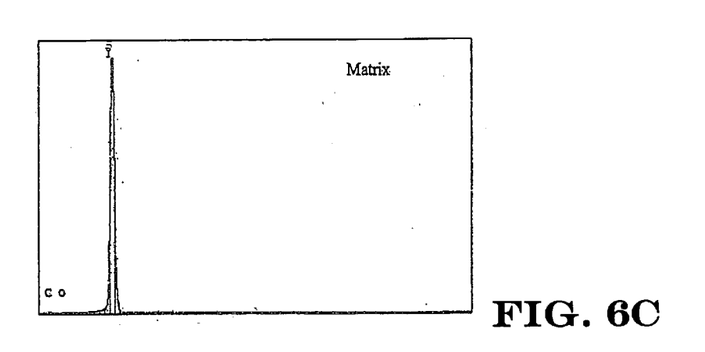
FIG. 6C is an EDAX pattern from the matrix area of the composite body of Example V.

A two inch (51 mm) square piece of the zero-stage composite material was placed flat (horizontally) in a BN coated graphite crucible contained within a graphite chamber. About 15 grams of silicon metal in lump form (Elkem Metals, Inc.) was placed on top of the square surface of the zero-stage body. The composite material was then thermally processed in substantially the same manner as the material in Example 4. As a result of this processing, the silicon melted and reactively infiltrated the carbon—carbon composite body to produce a more complex composite body having a matrix comprising silicon and silicon carbide. A sample of the complex composite material was metallographically prepared and examined in the optical microscope and in the SEM and analyzed chemically using energy dispersive x-ray analysis (EDAX). The microstructure specifically consists of carbon fibers dispersed in a matrix consisting of some SiC formed in-situ (e.g., from reaction of molten silicon with carbon from the phenolic resin), residual, unreacted silicon, and some residual, unreacted carbon. FIG. 6A, in particular, is an optical photomicrograph featuring the T-300 carbon fibers. Among the significant features of the photo is the absence of reaction of the carbon fibers with the molten silicon during processing. In other words, the carbon from the phenolic resin protected the carbon fibers during infiltration. The EDAX patterns of FIGS. 6B and 6C again are of the fiber and matrix portions of the composite, respectively. Just as in Example 4, the patterns show essentially no infiltration into or reaction of Si into the fiber. Accordingly, the gray phase that is seen in the photomicrograph is confirmed to be carbon, which conclusion is supported by the fact that this phase has the same gray level as the fibers, which are known to be carbon.

The composite body featuring the T-300 carbon fibers contained about 50–55 vol % C fibers, about 30–40% SiC and about 10–15% residual Si-bearing phase. The composite body featuring the EWC-600 carbon fibers, however, exhibited some chemical reaction of the fibers by the silicon infiltrant. Thus, its final composition was about 30–40 vol % C fibers, 50–60% SiC and about 10–20% residual Si-containing phase.

EXAMPLE VI

This Example demonstrates the fabrication of a carbon-fiber silicon composite body wherein the fibers are arranged as to exhibit quasi-isotropic properties.

A prepreg consisting of aligned Mitsubishi K13710 carbon fibers embedded in a RS-11 epoxy matrix was obtained from YLA, Inc. (Benicia, Calif.).

Pieces measuring about 2 inches (51 mm) square were cut from the prepreg at 0, 45 and 90 degree angles with respect to the fiber direction. The pieces were then stacked atop one another in the following order to make a quasi-isotropic laminate: 0, 90, +45, −45, +45, 90, 0 degrees orientation. While stacking the pieces, about 0.25 gram of Mitsubishi pitch (Grade AR) in powder form was spread onto each piece. The laminate was then heated in an air atmosphere oven under a slight uniaxial pressure (provided by a graphite cube measuring about 2 inches (51 mm) on a side) to melt the pitch. The heating was at 50 C per hour to a temperature of about 250 C, holding at about 250 C for about one hour, further heating to a temperature of about 340 C at a rate of about 50 C per hour, holding at about 340 C for about one hour, and then cooling at a rate of about 50 C per hour.

The laminate was then pyrolyzed in vacuum, specifically by heating to a temperature of about 900 C at a rate of about 100 C per hour, maintaining a temperature of about 900 C for about one hour, and then cooling at a rate of about 200 C per hour. The pyrolyzed laminate measured about 2 inches (51 mm) square by about 0.04 inch (1.0 mm) thick.

To carry out the reactive infiltration, about 2.4 grams of silicon metal in lump form (Elkem Metals, Inc.) was placed on top of the pyrolyzed laminate, which was then placed into a boron nitride coated graphite mold, which in turn was placed into a graphite chamber sufficiently non-hermetic so as to provide for atmosphere exchange. The graphite chamber and its contents were then placed into a vacuum furnace, which was then sealed, evacuated, and then energized. The contents of the graphite chamber were then heated to a temperature of about 1350 C at a rate of about 100 C per hour, maintained at a temperature of about 1350 C for about one hour, further heated to a temperature of about 1425 C at a rate of about 50 C per hour, maintained at a temperature of about 1425 C for about 15 minutes, and then cooled at a rate of about 200 C per hour.

Upon recovery from the furnace, the infiltrated laminate was found to contain about 50–55 vol % C fibers, about 8–10% SiC, and about 35–40% residual Si phase.

Characterization of Mechanical and Physical Properties

After the fabrication step, various mechanical and physical properties of the instant reaction-bonded ceramic composite materials were measured. Density was determined by the water immersion technique in accordance with ASTM Standard B 311. Flexural strength in four-point bending was determined based on ASTM Procedure No. D790 using a screw-driven Sintech model CITS-2000 universal testing machine under displacement control at a crosshead speed of about 0.51 mm/min. Specimens measuring about 50 mm in length by about 9.8 mm wide by about 2 to 4 mm in thickness were tested with the loading direction parallel to the 9.8 mm dimension and with inner and outer loading spans of 20 and 40 mm, respectively.

Measurement of CTE

Because the composite materials of the instant invention possess very low CTE's, conventional thermal mechanical analysis (TMA) using a dilatometer is not sufficiently sensitive. Instead, a laser interferometry technique was used, whereby parallel, opposing mirrors are mounted at opposite ends of the test specimen, and a laser beam is split in two, with each beam reflecting off one mirror and then combined to create an interference pattern. As the sample is heated, the changing pattern corresponds to the change in sample length, measured in wavelengths of the laser light.

Results of density, flexural strength and CTE of the instant low expansion carbon fiber composites are provided in Table II. When appropriate, the results are provided as a mean +/− one standard deviation.

TABLE II

Summary of properties of various carbon fiber composites.

| Example | Fiber | Lay up | Matrix | Density (g/cc) | Flexural Strength (MPa) | CTE (−50 to 100° C.) ppm/K |
|---|---|---|---|---|---|---|
| 5 | T300 | 8HS | C, SiC, Si | 2.394 | 64.5 | 0.96 +/− 0.01 |
| 4 | T300 | PW | BN, SiC, Si | 1.995 | 156 | 0.77 +/− 0.01 |
| 6 | K13710 | [0/90/+45/−45]s | SiC/Si | 2.278 | 115 | 1.06 |
| 5 | EWC-600 | 8HS | C, SiC, Si | 2.568 | 184 | 1.75 +/− 0.01 |
| 4 | EWC-600 | 8HS | BN, SiC, Si | 2.49 | 162.1 | −0.46 +/− 0.01 |

8HS: 8 harness satin weave;
PW: plain Weave

INDUSTRIAL APPLICABILITY

The methods and compositions of the present invention should find utility in applications requiring high specific stiffness, low thermal expansion coefficient, high toughness, high thermal conductivity and/or high wear resistance.

The present invention for making low or near-zero CTE metal matrix composite materials finds utility in the precision equipment, robotics, tooling, aerospace, electronic packaging and thermal management, and semiconductor fabrication industries, among others. The instant low expansion composites furthermore have a wider "zero CTE range" than do the typical low expansion glass or glass matrix composite material. In addition to desirable low CTE attributes, the carbon fiber metal matrix composites of the present invention may also provide high specific stiffness and high thermal conductivity. Accordingly, specific articles of manufacture contemplated by the present invention include semiconductor wafer handling devices, masks, vacuum chucks, electrostatic chucks, air bearing housings or support frames, electronic packages and substrates, machine tool bridges and bases, optical bench components, mirror substrates, mirror stages and flat panel display setters.

Although low CTE may not always be a specific requirement of certain friction products such as brakes and clutches, the carbon fiber reinforced silicon composites of the instant invention seem to possess many of the desirable properties sought in these friction applications.

An artisan of ordinary skill will appreciate that various modifications may be made to the invention herein described without departing from the scope or spirit of the invention as defined in the appended claims.

What is claimed is:

1. A carbon fiber reinforced composite body, comprising:
   (a) a plurality of carbon fibers;
   (b) a matrix comprising silicon carbide and an infiltrant metal comprising silicon
   (c) a zone of carbon disposed between said fibers and said matrix; and
   (d) wherein said composite body comprises at least about 20 percent by volume of said infiltrant metal and not more than about 40 percent by volume of said silicon carbide.

2. A carbon fiber reinforced composite body, comprising:
   (a) a matrix comprising silicon carbide and at least one metal comprising silicon;
   (b) a reinforcement comprising a plurality of carbon fibers;
   (c) at least one coating disposed between said fibers and said matrix; and
   (d) wherein said composite body comprises at least about 20 percent by volume of said metal and not more than about 40 percent by volume of said silicon carbide.

3. The composite body of claim 2, wherein said carbon fibers make up at least about 10% by volume of said composite body.

4. The composite body of claim 2, comprising at least about 45% by volume of said metal.

5. The composite body of claim 2, wherein said silicon carbide of said matrix comprises less than about 10% of said composite body.

6. The composite body of claim 2, further comprising a CTE less than about +2 ppm/K.

7. The composite body of claim 2, further possessing an absolute value of CTE less than about 1 ppm/K.

8. The composite body of claim 2, wherein said fibers have an isotropic or quasi-isotropic arrangement.

9. The composite body of claim 2, wherein said fibers are not arranged quasi-isotropically.

10. The composite body of claim 2, wherein said carbon fibers possess a negative CTE in the axial direction.

11. The composite body of claim 2, wherein said carbon fibers do not possess a negative CTE.

12. The composite body of claim 2, wherein said carbon fibers possess an elastic modulus of at least about 200 GPa in the axial direction.

13. The composite body of claim 2, wherein said reinforcement phase is present as at least one sheet or layer comprising said fibers randomly arranged within the plane of said sheet or layer.

14. The composite body of claim 2, wherein said reinforcement is present as at least one sheet or layer, and said thermal expansion coefficient is quasi-isotropic within the plane of said sheet or layer.

15. The composite body of claim 2, wherein said reinforcement is present as at least one sheet or layer comprising said fibers randomly arranged within the plane of said sheet or layer.

16. The composite body of claim 2, wherein said fibers comprise graphite having a negative thermal expansion coefficient in a fiber axis direction.

17. The composite body of claim 14, wherein said reinforcement comprises a plurality of said layers arranged substantially parallel to one another, each of said layers comprising a plurality of substantially parallel carbon fibers, wherein an absolute value of angle as measured between the longitudinal axes of said carbon fibers in one layer and those in an adjacent layer is selected from the group consisting of 0 degrees, 45 degrees, 60 degrees and 90 degrees.

18. The composite body of claim 2, wherein said matrix comprises at least one metal other than silicon.

19. The composite body of claim 2, wherein said silicon carbide of said matrix comprises about 1%–5% of said composite body.

20. A composite material comprising graphite fibers dispersed in a matrix material comprising silicon and silicon carbide, said graphite fibers possessing a negative CTE at least in the axial direction, said composite material further comprising at least about 50 percent by volume of said silicon and not more than about 20 percent by volume of said silicon carbide.

21. The composite material of claim 19, produced by a process comprising:
  (a) coating silicon carbide onto said graphite fibers;
  (b) collecting said fibers as a porous preform;
  (c) introducing a carbonaceous resin to said preform;
  (d) pyrolyzing said resin, thereby adding about 1–10 percent by weight of carbon to said preform;
  (e) contacting a source of silicon or silicon alloy in molten form to said carbon-containing preform;
  (f) infiltrating said molten silicon or silicon alloy into said carbon-containing preform, thereby forming said matrix material; and
  (g) solidifying said silicon or silicon alloy.

22. The composite material of claim 21, wherein at least some of said silicon carbide is provided on said graphite fibers as a protective coating intended to prevent direct contact of said graphite fibers with said silicon during processing.

23. The composite material of claim 20, wherein said fibers are provided as at least one substantially flat ply, and a coefficient of thermal expansion of said composite is quasi-isotropic within the plane of said ply.

24. The composite material of claim 20, wherein said fibers are provided in the form of a plurality of stacked plies, and further wherein said fibers are substantially unidirectional within a ply, and further wherein said plies are oriented with respect to one another as to produce a quasi-isotropic coefficient of thermal expansion within the plane of said stacked plies.

25. The composite material of claim 20, comprising at least about 30 percent by volume of said fibers.

26. The composite material of claim 20, further comprising a coefficient of thermal expansion no greater than about 4 ppm/K.

27. The composite material of claim 23, wherein an overall CTE of said composite in a quasi-isotropic direction is no greater than about 3 ppm/K.

28. The composite body of claim 2, wherein said at least one coating comprises elemental carbon.

29. The composite body of claim 2, wherein said metal consists essentially of said silicon.

30. The composite body of claim 2, wherein said silicon is present as an alloy.

31. The composite body of claim 2, wherein said carbon fibers are assembled in the form of a weave.

32. The composite body of claim 31, wherein said weave is selected from the group consisting of a plain weave and a harness satin weave.

33. The composite body of claim 2, wherein said at least one coating comprises silicon carbide.

34. The composite body of claim 28, wherein said coating comprising carbon is of sufficient thickness as to function as protection of said carbon fibers from chemical reaction at least with molten silicon.

35. The composite body of claim 28, wherein said coating comprising carbon is not reacted completely with molten silicon during processing, thereby leaving at least some residual coating comprising carbon that is able to function as a debond layer for said carbon fibers.

36. The composite material of claim 2, produced by a process comprising:
  (a) providing a plurality of carbon fibers;
  (b) collecting said fibers as a porous preform;
  (c) introducing a carbonaceous resin to said preform;
  (d) pyrolyzing said resin;
  (e) contacting a source of silicon or silicon alloy in molten form to said pyrolyzed preform;
  (f) infiltrating said molten silicon or silicon alloy into said pyrolyzed preform, thereby forming said matrix material; and
  (g) solidifying said silicon or silicon alloy.

37. The composite material of claim 2, produced by a process comprising:
  (a) providing a prepreg comprising a plurality of carbon fibers dispersed in a carbonaceous resin;
  (d) first curing, and then pyrolyzing said resin, thereby forming a zero-stage body;
  (e) contacting a source of silicon or silicon alloy in molten form to said zero-stage body;
  (f) infiltrating said molten silicon or silicon alloy into said zero-stage body, thereby forming said matrix material; and
  (g) solidifying said silicon or silicon alloy.

38. The composite body of claim 37, wherein said resin is pyrolyzed under vacuum.

39. The composite body of claim 37, wherein said fibers of said prepreg are highly organized.

40. The composite body of claim 39, further comprising at least two of said prepreg, and wherein said at least two prepregs are laminated.

* * * * *